(12) United States Patent
Hong

(10) Patent No.: US 8,097,505 B2
(45) Date of Patent: Jan. 17, 2012

(54) METHOD OF FORMING ISOLATION LAYER IN SEMICONDUCTOR DEVICE

(75) Inventor: Ji-Ho Hong, Suwon-Si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 815 days.

(21) Appl. No.: 12/197,267

(22) Filed: Aug. 24, 2008

(65) Prior Publication Data
US 2009/0056092 A1  Mar. 5, 2009

(30) Foreign Application Priority Data
Aug. 28, 2007  (KR) .................. 10-2007-0086534

(51) Int. Cl.
*H01L 21/336* (2006.01)
(52) U.S. Cl. ........ 438/257; 438/266; 438/424; 438/435; 257/E21.546
(58) Field of Classification Search .......... None
See application file for complete search history.

(56) References Cited

U.S. PATENT DOCUMENTS

| | | | | |
|---|---|---|---|---|
| 6,991,985 B2 * | 1/2006 | Dong et al. | .................. | 438/261 |
| 7,015,099 B2 * | 3/2006 | Kim et al. | ..................... | 438/257 |
| 7,235,458 B2 * | 6/2007 | Yang | ............................ | 438/424 |
| 2007/0087565 A1 * | 4/2007 | Culmsee et al. | ............. | 438/675 |

* cited by examiner

*Primary Examiner* — Zandra Smith
*Assistant Examiner* — Khanh Duong
(74) *Attorney, Agent, or Firm* — Sherr & Vaughn, PLLC

(57) ABSTRACT

A method of forming an isolation layer in a semiconductor device is disclosed, by which breakdown voltage and PN junction leakage characteristics of the isolation layer are enhanced. Embodiments include depositing a pad nitride layer over a semiconductor substrate, reducing the thickness of the pad nitride layer by etching a portion of the pad nitride layer, forming a tetraethyl orthosilicate (TEOS) oxide layer over the remaining pad nitride layer, forming a trench by selectively removing the tetraethyl orthosilicate oxide layer and the pad nitride layer over an isolation area of the semiconductor substrate, depositing an high density plasma oxide layer over the substrate to fill the trench, and forming an isolation layer by planarizing the high density plasma oxide layer and the tetraethyl orthosilicate oxide layer.

10 Claims, 9 Drawing Sheets

NAA to NAA Isolation

METHOD OF FORMING ISOLATION LAYER IN SEMICONDUCTOR DEVICE

The present application claims priority under 35 U.S.C. 119 to Korean Patent Application No. 10-2007-0086534 (filed on Aug. 28, 2007), which is hereby incorporated by reference in its entirety.

BACKGROUND

Generally, a plurality of cells including such unit devices as transistors, capacitors and the like are integrated over a limited area according to a size of a semiconductor device. For independent operational characteristics of the cells, electrical isolation is necessary. To achieve the electrical isolation between cells, LOCOS (local oxidation of silicon) or STI (shallow trench isolation) may be used. In LOCOS, a silicon substrate is recessed and a field oxide layer is then grown in the recess. In STI, a trench is formed by vertically etching a silicon substrate, and the trench is filled with an insulator.

In a LOCOS device, the field oxide layer may expand into an active area to generate a bird's beak from an edge part of the field oxide layer. Hence, LOCOS has the disadvantage that the size of the active area is decreased. Conversely, in STI, a narrow and deep trench is formed by dry etch such as reactive ion etch, plasma etch and the like. The trench is filled with an insulating layer, whereby the problem of bird's beak does not arise. In STI the surface of the trench filled with the insulating layer is planarized. And, STI has an advantage in downsizing a semiconductor device due to the relatively small size of the device isolation area. Therefore, a device isolation layer may be formed by STI in a 90 nm-scale semiconductor device.

Figure 1A:
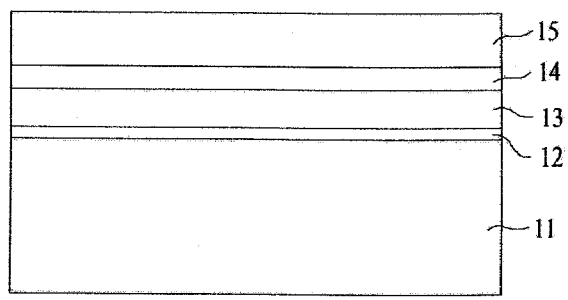

A method of forming an isolation layer in a semiconductor device according to a related art is explained with reference to the accompanying drawings as follows. FIGS. 1A to 1E are cross-sectional diagrams of a method of forming an isolation layer in a semiconductor device using STI according to the related art. Referring to FIG. 1A, a buffer oxide layer 12, a pad nitride layer 13 and a TEOS oxide layer 14 may be sequentially formed over a p-type semiconductor substrate 11. A photoresist layer 15 may be formed over the TEOS oxide layer 14.

The pad nitride layer 13 plays a role as a mask in etching a semiconductor substrate for a device isolation area and also plays a role as an etch stopper in CMP (chemical mechanical polishing) process. Hence, the pad nitride layer 13 may be formed about 1,000 Å thick by LPCVD in a 90 nm-scale semiconductor device.

Figure 1B:
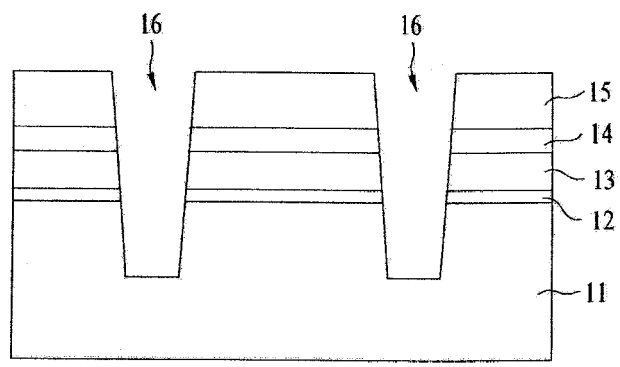

Referring to FIG. 1B, the photoresist layer 15 may be patterned by performing exposure and development on the photoresist layer 15 using a mask. The photoresist layer 15 remains in an active area but is removed from a device isolation area. The TEOS oxide layer 14, the pad nitride layer 13 and the buffer oxide layer 12 are etched using the patterned photoresist layer 15 as a mask, whereby the p-type semiconductor substrate 11 is partially exposed. Subsequently, a trench 16 is formed by etching the exposed p-type semiconductor substrate 11 to a prescribed depth.

Figure 1C:
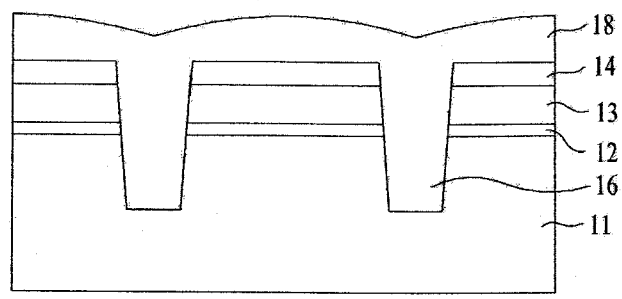

Referring to FIG. 1C, the remaining photoresist layer 15 is removed. An HDP (high density plasma) oxide layer 18 is deposited over the substrate until the trench 16 is sufficiently filled with the HDP oxide layer 18.

Figure 1D:
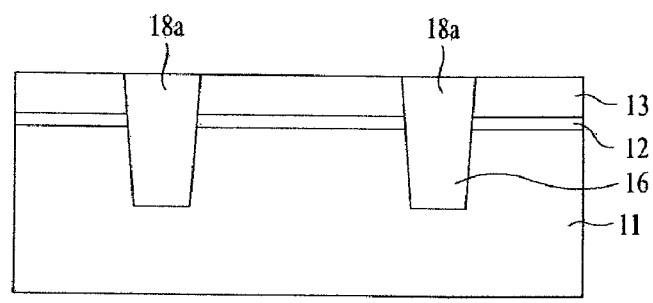

Referring to FIG. 1D, a device isolation layer 18a is formed within the trench 16 by removing the HDP oxide layer 18 and the TEOS oxide layer 14 by CMP (chemical mechanical polishing) until a surface of the pad nitride layer 13 is exposed.

Figure 1E:
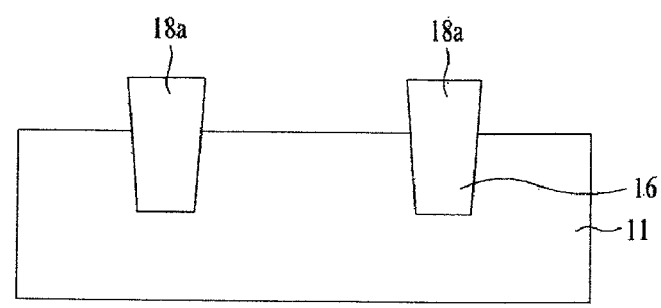

Referring to FIG. 1E, the pad nitride layer 13 and the pad oxide layer 12 are removed. Finally, a specific semiconductor device is fabricated by performing necessary processes for gate electrode formation, impurity ion implantation and the like. However, the related art device isolation method for a semiconductor device has problems.

As mentioned above, the pad nitride layer plays a role as a mask in etching the semiconductor substrate of the device isolation area and also plays a role as an etch stopper in CMP. As the pad nitride layer deposited by LPCVD becomes thinner, the trench can be more sufficiently filled up with the HDP oxide layer to enhance the device isolation characteristic. Yet, if the pad nitride layer deposited by LPCVD gets thinner, more stress is applied to the pad nitride layer. Hence, the thickness of the pad nitride layer should be maintained as about 1,000 Å for at least the limited margin of the thickness. Therefore, in the related art device isolation forming method, the gap filling characteristics of the HDP oxide layer are limited, limiting the enhancement of device isolation characteristics.

SUMMARY

Embodiments relate to a method of fabricating a semiconductor device, and more particularly, to a method of forming an isolation layer in a semiconductor device. Although embodiments are suitable for a wide scope of applications, they are particularly suitable for enhancing isolation layer characteristics in a 90 nm-scale semiconductor device.

Embodiments relate to a method of forming an isolation layer in a semiconductor device, by which a gap filling characteristic of an HDP oxide layer is enhanced by depositing a pad nitride layer by LPCVD and then etching the pad nitride layer to a prescribed thickness, and by which device isolation characteristic can be enhanced as well.

Embodiments relate to a method of forming an isolation layer in a semiconductor device which includes depositing a pad nitride layer over a semiconductor substrate, reducing the thickness of the pad nitride layer by etching a portion of the pad nitride layer, forming a tetraethyl orthosilicate oxide layer over the remaining pad nitride layer, forming a trench by selectively removing the tetraethyl orthosilicate oxide layer and the pad nitride layer over an isolation area of the semiconductor substrate, depositing an high density plasma oxide layer over the substrate to fill the trench, and forming an isolation layer by planarizing the high density plasma oxide layer and the tetraethyl orthosilicate oxide layer.

DRAWINGS

FIGS. 1A to 1E are cross-sectional diagrams of a method of forming an isolation layer according to related art.

Example FIGS. 2A to 2G are cross-sectional diagrams of a method of forming a device isolation layer in a semiconductor device according to embodiments.

Figure 3A:
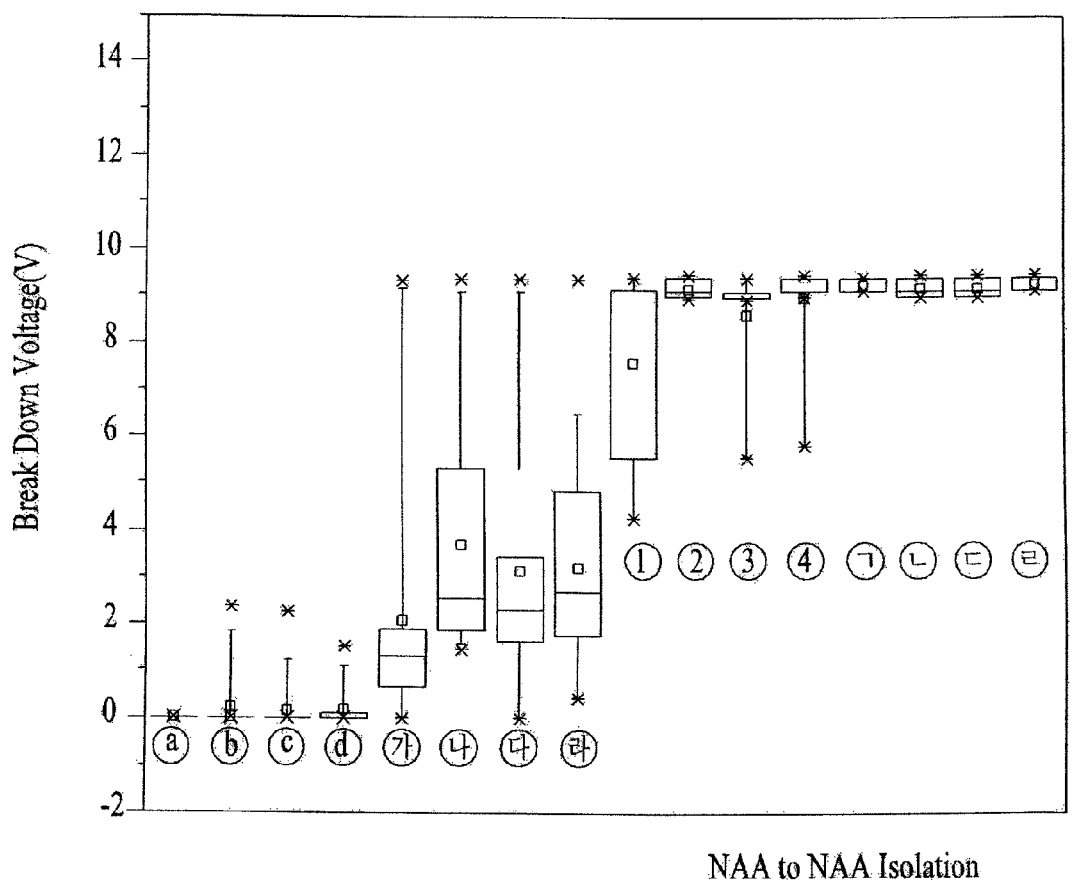

Example FIG. 3A is a graph for breakdown voltage between n-type active area and n-type active area in a semiconductor device with a device isolation layer fabricated according to embodiments.

Figure 3B:
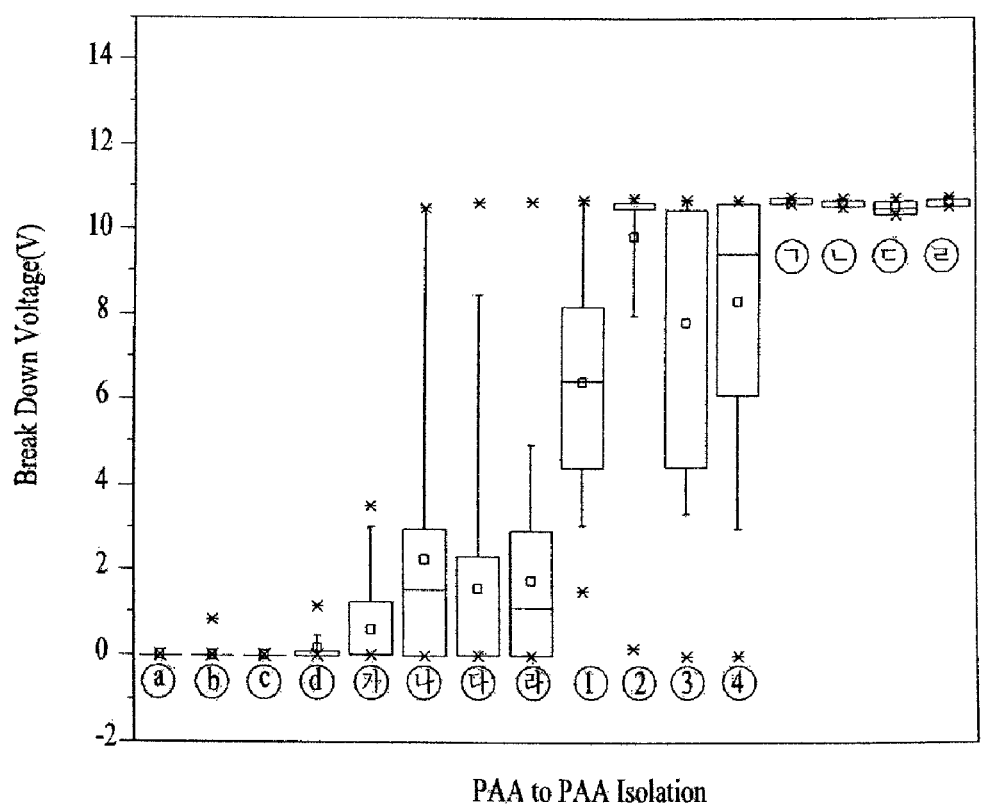

Example FIG. 3B is a graph for breakdown voltage between p-type active area and p-type active area in a semiconductor device with a device isolation layer fabricated according to embodiments.

Figure 4A:
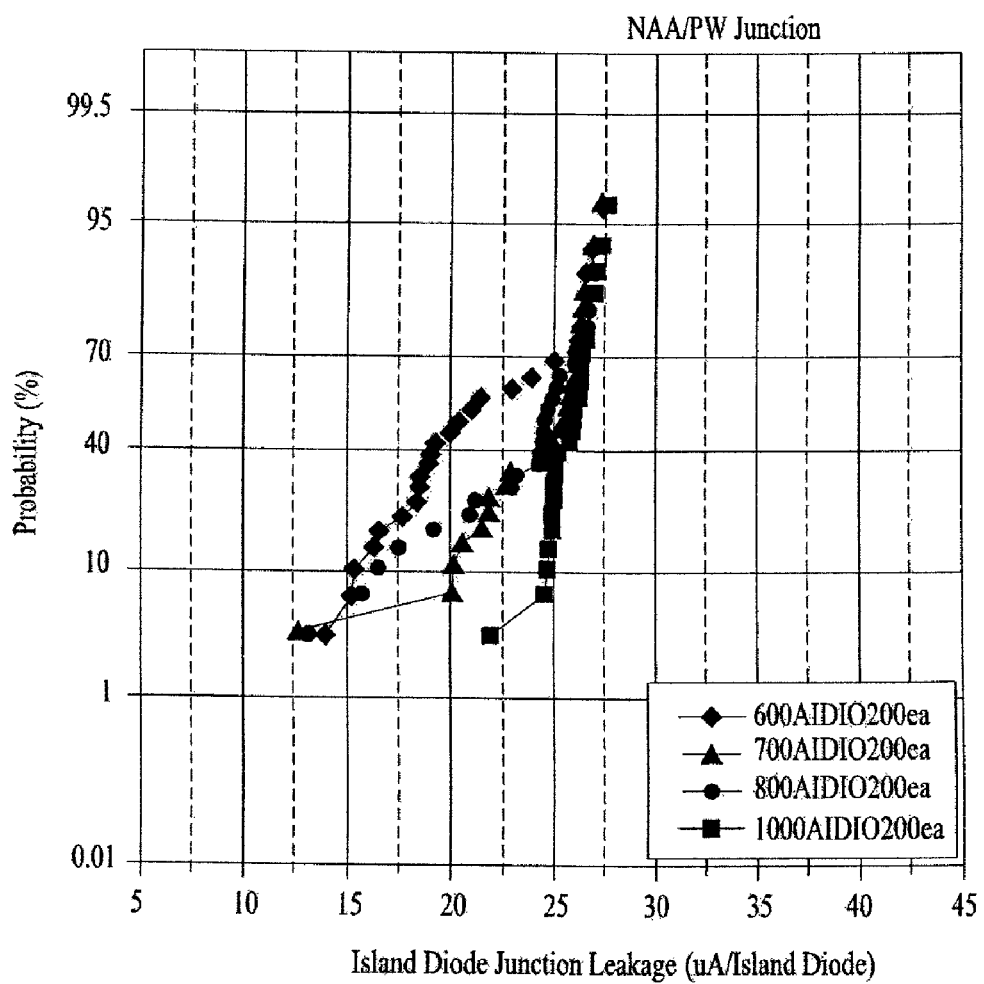

Example FIG. 4A is a graph for junction leakage current between p-well and n-type active area in a semiconductor device with a device isolation layer fabricated according to embodiments.

Figure 4B:
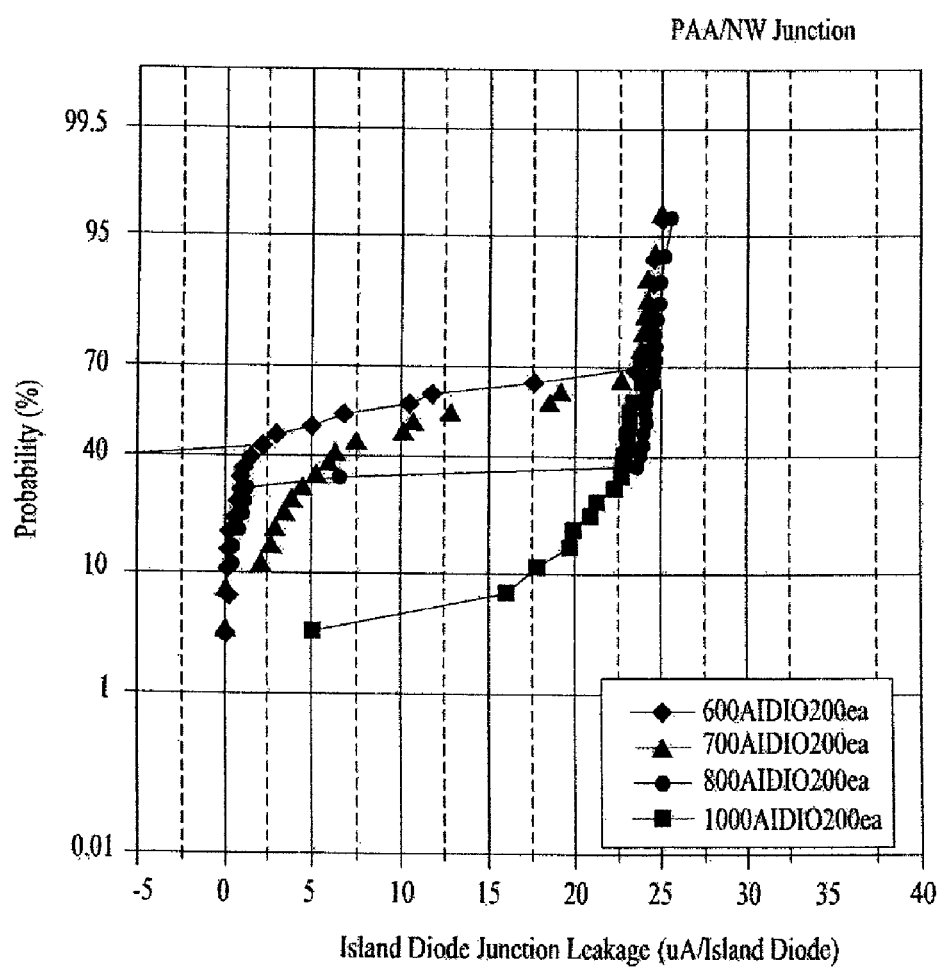

Example FIG. 4B is a graph for junction leakage current characteristic between n-well and p-type active area in a semiconductor device with a device isolation layer fabricated according to embodiments.

DESCRIPTION

Example FIGS. 2A to 2G are cross-sectional diagrams of a method of forming a device isolation layer in a semiconductor device according to embodiments. Referring to example FIG. 2A, in a method of forming a device isolation layer in a semiconductor device according to embodiments, a buffer oxide layer 32 and a pad nitride layer 33 may be sequentially formed over a p-type semiconductor substrate 31. The pad nitride layer 33 may be formed about 1,000 Å~1,500 Å thick by LPCVD.

Figure 2A:
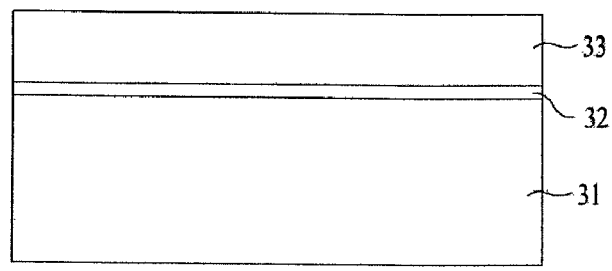
Figure 2B:
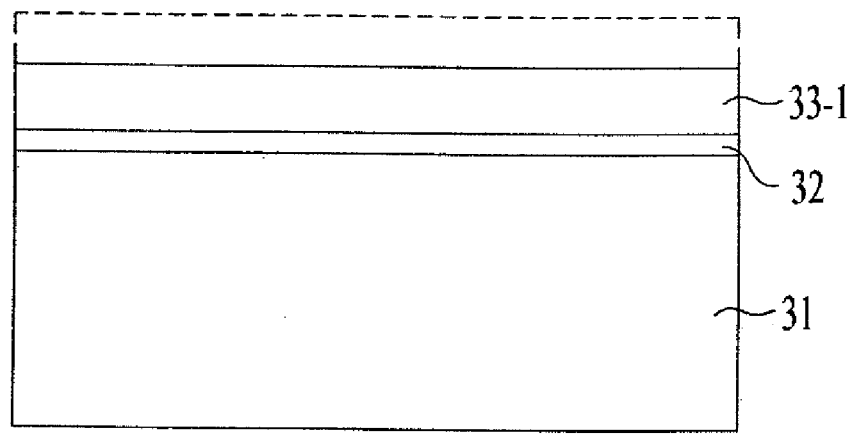

Referring to example FIG. 2B, the pad nitride layer 33 may be removed in part using $H_3PO_4$ solution or the like. In particular, a thickness of a remaining pad nitride layer 33-1 may be maintained between 600 Å~800 Å.

Figure 2C:
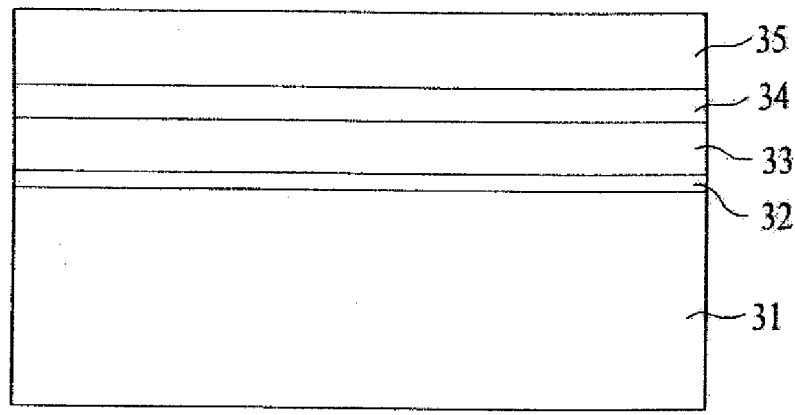
Figure 2D:
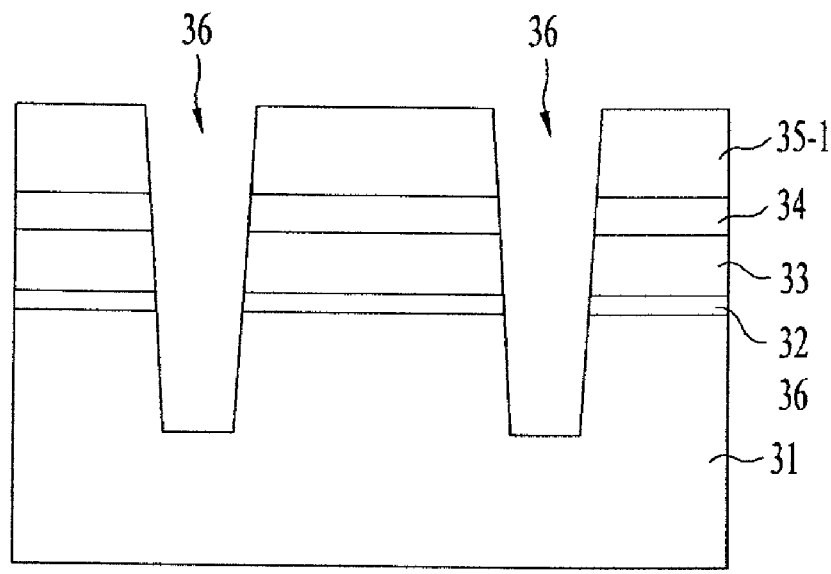

Referring to example FIG. 2C, a TEOS oxide layer 34 and a photoresist layer 35 may be sequentially formed over the remaining pad nitride layer 33-1. Referring to example FIG. 2D, a photoresist pattern 35-1 may be formed by performing exposure and development on the photoresist layer 35. In particular, the photoresist pattern may be formed to expose a device isolation area but covering an active area.

The p-type semiconductor substrate 31 of the device isolation area may be exposed by etching the TEOS oxide layer 34, the nitride layer 33 and the buffer oxide layer 32 using the photoresist pattern 35-1 as a mask. A trench 36 may be formed by etching the exposed p-type semiconductor substrate 31 to a prescribed depth.

The depth of the trench may vary according to the type of semiconductor device being manufactured. In a 90 nm-scale semiconductor device of logic circuit, the depth may be set to about 3,000 Å~4,000 Å. In case of a 90 nm-scale non-volatile memory device, the depth may be set to about 2,500 Å~3,000 Å.

Figure 2E:
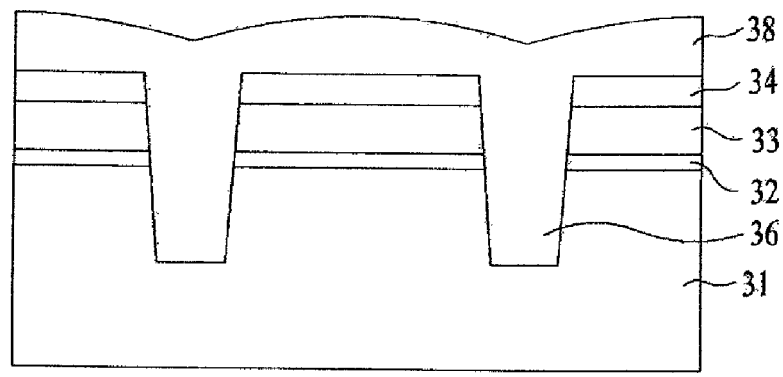
Figure 2F:
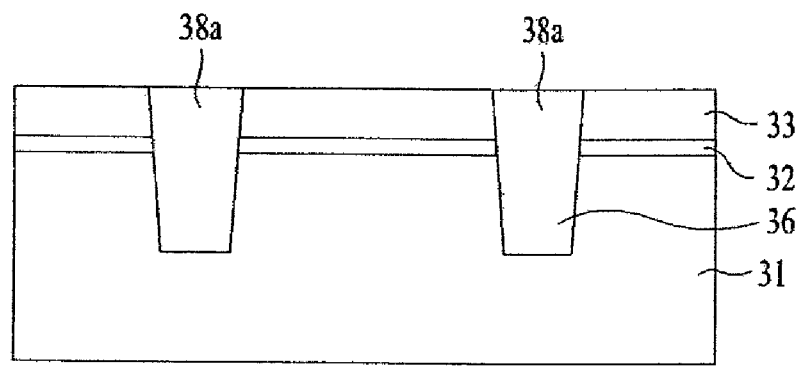
Figure 2G:
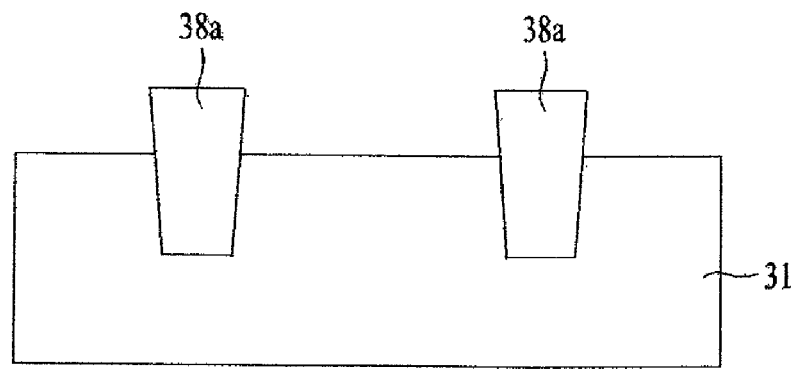

Referring to example FIG. 2E, after the photoresist pattern 35-1 has been removed, an HDP (high density plasma) oxide layer 38 may be deposited over the substrate so that the trench 36 can be filled with the HDP. Referring to example FIG. 2F, a device isolation layer 38a may be formed within the trench 36 by removing the HDP oxide layer 38 and the TEOS oxide layer 34 by CMP until a surface of the pad nitride layer 33 is exposed. Referring to example FIG. 2G, the pad nitride layer 33 and the pad oxide layer 32 are removed. Finally, a particular semiconductor device may be fabricated by performing necessary processes for gate electrode formation, impurity ion implantation and the like.

As mentioned in the foregoing description, the remaining pad nitride layer 33-1, with a reduced thickness, may be formed by depositing the pad nitride layer 33 1,000 Å~1,500 Å thick by LPCVD and then wet-etching the deposited pad nitride layer 33. As the thickness of the deposited pad nitride layer 33 is decreased, the gap filling characteristics of the HDP oxide layer are enhanced. Therefore, the device isolation characteristics of the device isolation layer are enhanced. This may be described through simulation data as follows.

Example FIG. 3A is a graph for breakdown voltage between n-type active area and n-type active area in a semiconductor device with a device isolation layer fabricated according to embodiments. Example FIG. 3B is a graph for breakdown voltage between p-type active area and p-type active area in a semiconductor device with a device isolation layer fabricated according to embodiments. Example FIG. 4A is a graph for junction leakage current between p-well and n-type active area in a semiconductor device with a device isolation layer fabricated according to embodiments and example FIG. 4B is a graph for junction leakage current characteristic between n-well and p-type active area in a semiconductor device with a device isolation layer fabricated according to embodiments.

Referring to example FIG. 3A, the circled letters a, b, c and d ("a°", "b°", "c°" and "d°" hereinafter) reference semiconductor devices having an isolation layer between n-type active area and active area with a thickness set to 0.119 μm. In particular, a° indicates an instance where a thickness of a deposited pad nitride layer 33 is 1,000 Å, b° indicates an instance where a thickness of a pad nitride layer 33-1 remaining after wet-etching the pad nitride layer 33 is 800 Å, c° indicates an instance where a thickness of a pad nitride layer 33-1 remaining after wet-etching the pad nitride layer 33 is 700 Å, and d° indicates an instance where a thickness of a pad nitride layer 33-1 remaining after wet-etching the pad nitride layer 33 is 600 Å.

The symbols ⓐ, ⓑ, ⓒ and ⓓ indicate instances where a thickness of an isolation layer between n-type active area and active area is set to 0.133 μm. In particular, ⓐ indicates an instance where a thickness of a deposited pad nitride layer 33 is 1,000 Å, ⓑ indicates an instance where a thickness of a pad nitride layer 33-1 remaining after wet-etching the pad nitride layer 33 is 800 Å, ⓒ indicates an instance where a thickness of a pad nitride layer 33-1 remaining after wet-etching the pad nitride layer 33 is 700 Å, and ⓓ indicates an instance where a thickness of a pad nitride layer 33-1 remaining after wet-etching the pad nitride layer 33 is 600 Å.

The symbols, ①, ②, ③ and ④ indicate instances where a thickness of an isolation layer between n-type active area and active area is set to 0.147 μm. In particular, ① indicates an instance where a thickness of a deposited pad nitride layer 33 is 1,000 Å, ② indicates an instance where a thickness of a pad nitride layer 33-1 remaining after wet-etching the pad nitride layer 33 is 800 Å, ③ indicates an instance where a thickness of a pad nitride layer 33-1 remaining after wet-etching the pad nitride layer 33 is 700 Å, and ④ indicates an instance where a thickness of a pad nitride layer 33-1 remaining after wet-etching the pad nitride layer 33 is 600 Å.

Moreover, ⊙, ⊚, ⊕ and ⊖ indicate instances where a thickness of an isolation layer between n-type active area and active area is set to 0.161 μm. In particular, ⊙ indicates an instance where a thickness of a deposited pad nitride layer 33 is 1,000 Å, ⊚ indicates an instance where a thickness of a pad nitride layer 33-1 remaining after wet-etching the pad nitride layer 33 is 800 Å, ⊕ indicates an instance where a thickness of a pad nitride layer 33-1 remaining after wet-etching the pad nitride layer 33 is 700 Å, and ⊖ indicates an instance where a thickness of a pad nitride layer 33-1 remaining after wet-etching the pad nitride layer 33 is 600 Å.

As observed from example FIG. 3A, in instances where the thickness between the n-type active area and the active area is 0.119 μm or 0.133 μm, a distribution chart is dispersive regardless of the thickness of the pad nitride layer 33 despite the breakdown voltage being relatively low or high. Yet in instances where the thickness between the n-type active area and the active area is 0.147 μm, if the thickness of the pad nitride layer 33 is 1,000 Å, the distribution chart is scattered despite high breakdown voltage. If the thickness of the pad nitride layer 33 is 800 Å (②), 700 Å (③) or 600 Å (④) the distribution chart is centralized and the breakdown voltage is high. In instances where the thickness between the n-type active area and the active area is 0.161 μm, it can be observed that the breakdown voltage characteristic is good in all conditions.

Referring to example FIG. 3B, a°, b°, c° and d° indicate instances where a thickness of an isolation layer between p-type active area and active area is set to 0.119 μm. In particular, a° indicates an instance where a thickness of a pad nitride layer 33 is 1,000 Å, b° indicates an instance where a thickness of a pad nitride layer 33-1 remaining after wet-etching the pad nitride layer 33 is 800 Å, c° indicates an instance where a thickness of a pad nitride layer 33-1 remaining after wet-etching the pad nitride layer 33 is 700 Å, and d° indicates an instance where a thickness of a pad nitride layer 33-1 remaining after wet-etching the pad nitride layer 33 is 600 Å.

And, ⓑ, ⓒ, ⓓ and ⓔ indicate instances where a thickness of an isolation layer between p-type active area and active area is set to 0.133 μm. In particular, ⓑ indicates an instance where a thickness of a pad nitride layer 33 is 1,000 Å, ⓒ indicates an instance where a thickness of a pad nitride layer 33-1 remaining after wet-etching the pad nitride layer 33 is 800 Å, ⓓ indicates an instance where a thickness of a pad nitride layer 33-1 remaining after wet-etching the pad nitride layer 33 is 700 Å, and ⓔ indicates an instance where a thickness of a pad nitride layer 33-1 remaining after wet-etching the pad nitride layer 33 is 600 Å.

And, ①, ②, ③ and ④ indicate instances where a thickness of an isolation layer between p-type active area and active area is set to 0.147 μm. In particular, ① indicates an instance where a thickness of a pad nitride layer 33 is 1,000 Å, ② indicates an instance where a thickness of a pad nitride layer 33-1 remaining after wet-etching the pad nitride layer 33 is 800 Å, ③ indicates an instance where a thickness of a pad nitride layer 33-1 remaining after wet-etching the pad nitride layer 33 is 700 Å, and ④ indicates an instance where a thickness of a pad nitride layer 33-1 remaining after wet-etching the pad nitride layer 33 is 600 Å.

Moreover, ⊙, ⊚, ⊕ and ⊖ indicate instances where a thickness of an isolation layer between p-type active area and active area is set to 0.161 μm. In particular, ⊙ indicates an instance where a thickness of a pad nitride layer 33 is 1,000 Å, ⊚ indicates an instance where a thickness of a pad nitride layer 33-1 remaining after wet-etching the pad nitride layer 33 is 800 Å, ⊕ indicates an instance where a thickness of a pad nitride layer 33-1 remaining after wet-etching the pad nitride layer 33 is 700 Å, and ⊖ indicates an instance where a thickness of a pad nitride layer 33-1 remaining after wet-etching the pad nitride layer 33 is 600 Å.

As observed from example FIG. 3B, in instances where the thickness between the n-type active area and the active area is 0.119 μm or 0.133 μm, a distribution chart is dispersive regardless of the thickness of the pad nitride layer 33 despite the breakdown voltage being relatively low or high. Yet in instances where the thickness between the n-type active area and the active area is 0.147 μm, if the thickness of the pad nitride layer 33 is 1,000 Å, the distribution chart is scattered despite high breakdown voltage. If the thickness of the pad nitride layer 33 is 800 Å (②), 700 Å (③) or 600 Å (④), the distribution chart is centralized and the breakdown voltage is high. In instances where the thickness between the p-type active area and the active area is 0.161 μm, it can be observed that the breakdown voltage characteristic is good in all conditions.

Referring to example FIG. 4A and example FIG. 4B, in PN junction leakage, as the thickness of the pad nitride layer 33 gets smaller, average leakage current is reduced. Yet, uniformity of the leakage current gets better if the thickness of the pad nitride layer 33 is increased. As observed from example FIGS. 4A to 4B, since the isolation layer may be formed by depositing the pad nitride layer 33 1,000 Å~1,500 Å thick by LPCVD and then removing a portion of the pad nitride layer 33 200 Å~400 Å thick, a gap filling margin of the HDP oxide layer is enhanced. The pad nitride layer 33 is also free from stress. Moreover, if a semiconductor device is fabricated using the isolation layer forming method of embodiments, the breakdown voltage and PN junction leakage characteristics between active areas can be enhanced.

Accordingly, embodiments provide the following effects and/or advantages. Since the isolation layer may be formed by depositing the pad nitride layer 33 1,000 Å~1,500 Å thick by LPCVD, and then removing a portion of the pad nitride layer 200 Å~400 Å thick, a gap filling margin of the HDP oxide layer may be enhanced. The pad nitride layer is also free from stress. If a semiconductor device is fabricated using the isolation layer forming method of embodiments, the breakdown voltage and PN junction leakage characteristics between active areas can be enhanced.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method comprising:
depositing a pad nitride layer over a semiconductor substrate;
reducing the thickness of the pad nitride layer by etching a portion of the pad nitride layer;
forming a tetraethyl orthosilicate oxide layer over the remaining pad nitride layer;
forming a trench by selectively removing the tetraethyl orthosilicate oxide layer and the pad nitride layer over an isolation area of the semiconductor substrate;
depositing an high density plasma oxide layer over the substrate to fill the trench; and
forming an isolation layer by planarizing the high density plasma oxide layer and the tetraethyl orthosilicate oxide layer.

2. The method of claim 1, wherein depositing the pad nitride layer comprises depositing the pad nitride layer to a thickness of about 1,000 Å~1,500 Å by low pressure chemical vapor deposition.

3. The method of claim 1, wherein reducing the thickness of the pad nitride layer comprises wet etch using $H_3PO_4$ solution.

4. The method of claim 1, wherein reducing the thickness of the pad nitride layer comprises etching the pad nitride layer to set the thickness of the remaining pad nitride layer to about 600 Å~800 Å.

5. The method of claim 1, comprising forming a pad oxide layer over the semiconductor substrate before depositing the pad nitride layer.

6. The method of claim 1, wherein forming a trench comprises:
- forming a photoresist layer over the tetraethyl orthosilicate oxide layer;
- forming a photoresist pattern exposing the isolation area without exposing an active area by performing photolithography on the photoresist layer;
- exposing the semiconductor substrate by etching the tetraethyl orthosilicate oxide layer, the remaining pad nitride layer and the buffer oxide layer using the photoresist pattern as a mask; and
- forming the trench by etching the exposed semiconductor substrate.

7. The method of claim 6, wherein the trench is formed to a depth of 3,000 Å~4,000 Å.

8. The method of claim 6, wherein the trench is formed to a depth of 2,500 Å~3,000 Å.

9. The method of claim 1, wherein, in forming the isolation layer by planarizing the high density plasma oxide layer and the tetraethyl orthosilicate oxide layer, the isolation layer is formed within the trench by removing the high density plasma oxide layer and the tetraethyl orthosilicate oxide layer to expose a surface of the remaining pad nitride layer by chemical mechanical polishing.

10. The method of claim 1, wherein depositing the pad nitride layer comprises depositing SiN over the semiconductor substrate.

* * * * *